(12) United States Patent
Horigome et al.

(10) Patent No.: US 6,389,272 B1
(45) Date of Patent: May 14, 2002

(54) RECEIVER WITH AUTO GAIN CONTROL CIRCUIT OF RF SIGNAL

(75) Inventors: Fumihiko Horigome; Tetsuya Yamada, both of Saitama (JP)

(73) Assignee: Pioneer Electronic Corporation, Tokyo (JP)

( * ) Notice: Subject to any disclaimer, the term of this patent is extended or adjusted under 35 U.S.C. 154(b) by 0 days.

(21) Appl. No.: 09/264,853

(22) Filed: Mar. 9, 1999

(30) Foreign Application Priority Data

Mar. 10, 1998 (JP) .......................................... 10-076649

(51) Int. Cl.[7] ................................................. H04B 1/06
(52) U.S. Cl. ............................... 455/234.1; 455/232.1; 455/249.1
(58) Field of Search ........................... 455/232.1, 234.1, 455/241.1, 249.1, 251.1, 253.2, 254.1, 242.2, 243.1, 245.1, 245.2, 246.1, 247.1, 250.1; 348/726, 725, 731, 732, 733, 735

(56) References Cited

U.S. PATENT DOCUMENTS 5,369,792 A * 11/1994 Matsumoto et al. ..... 455/245.1
5,722,060 A    2/1998 Horigome ................ 455/234.1
6,044,253 A * 3/2000 Tsumura ................. 455/234.1

FOREIGN PATENT DOCUMENTS

JP          8-307288          11/1996

* cited by examiner

Primary Examiner—Nguyen T. Vo
Assistant Examiner—Naghmeh Mehrpour
(74) Attorney, Agent, or Firm—Morgan, Lewis & Bockius LLP

(57) ABSTRACT

A receiver including an attenuator for attenuating an antenna input signal and producing an output signal; a first filter for filtering the output signal of the attenuator and producing an output signal; an RF amplifier for amplifying the output signal from the first filter and producing an output signal; a second filter for filtering the output signal from the RF amplifier and producing an output signal; a first auto gain control circuit including a first auto gain control driving stage outputting a first control signal for controlling the gain of the attenuator; and a second auto gain control circuit including a second auto gain control driving stage outputting a second control signal for controlling the gain of the RF amplifier and for controlling the gain of the attenuator.

16 Claims, 7 Drawing Sheets

RECEIVER WITH AUTO GAIN CONTROL CIRCUIT OF RF SIGNAL

This application claims the benefit of Japanese Patent Application No. 10-76649, filed Mar. 10, 1998, which is hereby incorporated by reference.

BACKGROUND OF THE INVENTION

1. Field of the Invention

This invention relates to receiver technology, and more particularly, to a receiver with an auto gain control circuit of an RF signal.

2. Discussion of the Related Art

A common goal in the art of RF-AGC circuits for use in receivers is to avoid any distortion of an RF amplifier of the receiver. Specifically, when an input signal level exceeds a predetermined level, the gain of an RF amplifier within the receiver is controlled so as to make its output level constant. This control reduces the negative effects resulting from intermodulation (IM).

In most cases, a sufficient attenuation during reception cannot be achieved by controlling the RF amplifier alone. Accordingly, an attenuator is generally disposed within the receiver before the RF amplifier to attenuate the input signal. A sufficient attenuation is made possible by the ability to control both the attenuator and the RF amplifier.

On the other hand, Unexamined Published Japanese Patent Application No. HEI#8-307288 has disclosed another proposal. According to this application, an RF-AGC circuit is constructed which uses an output of an antenna tuning stage along with an output of an RF tuning stage to control attenuation. The output of the antenna tuning stage has a broader band width than the output of the RF tuning stage. This arrangement allows the aforementioned RF-AGC circuit to respond to undesired signals in frequencies away from a desired frequency to be tuned in an effort to minimize distortion resulting from these undesired signals.

FIG. 7 shows the RF-AGC circuit disclosed in the aforementioned Unexamined Published Japanese Patent Application No. HEI#8-307288. Only components relating to this specification are indicated in FIG. 7. An antenna input signal received by an antenna is subjected to band limitation and amplification by a predetermined amount at an antenna tuning stage 1, RF amplifier 2, and RF tuning stage 3, and then input to a mixer (MIX) 4. In the mixer 4, the signal input to the mixer and a signal from a VCO 6 are mixed so as to form an IF signal. The IF signal is supplied to an IF amplifier and FM detector (not shown) at following stages via an IF filter 5. Because the structure and arrangement of such components are well known in the receiver art, a further description thereof is not deemed to be necessary.

In the RF-AGC circuit 33, a control signal is generated according to particular signals within the receiver, each having a different band, and more particularly being the output of the antenna tuning stage 1, the output of RF tuning stage 3, and the output of the mixer 4. The output a of the antenna tuning stage 1, the output b of the RF tuning stage 3, and the output c of the mixer 4 are respectively fetched into amplifiers 7–9 as alternating current (AC) amplifiers and these outputs a–c are respectively amplified by those amplifiers 7–9 and then summed up by an adding stage 25. Then, the amplitude of a signal produced by the above addition is detected by a detecting stage 26. When this detection output level exceeds a reference voltage V5, a drive signal is outputted from the AGC driving stage 28 to the antenna tuning stage 1 and to the RF amplifier 2. The output drive signal is utilized for control of the gain of the RF amplifier 2 and also for control of an antenuator 20 in the antenna tuning stage 1, whereby the output of the RF amplifier 2 is controlled not to exceed a predetermined level.

However, in such a control arrangement, the RF amplifier 2 and the antenna tuning stage 1 are controlled by an output signal a of the antenna tuning stage 1. In such an arrangement, although the control on the antenna tuning stage 1 causes no problem because it is a feedback control, the RF amplifier 2 is not capable of forming a feedback loop. As a result, the control on the RF amplifier 2 becomes excessive so that a large attenuation is produced, resulting in an interruption in the played back sound being caused.

SUMMARY OF THE INVENTION

Accordingly, the present invention is directed to a receiver that substantially obviates one or more of the problems due to limitations and disadvantages of the related art.

An object of the present invention is the provision of a receiver having an RF-AGC circuit that controls the RF amplifier in a way that results in an improved continuity of the played back sound.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the receiver includes an attenuator for attenuating an antenna input signal and producing an output signal; a first filter for filtering the output signal of the attenuator and producing an output signal; an RF amplifier for amplifying the output signal from the first filter and producing and output signal; a second filter for filtering the output signal from the RF amplifier and producing an output signal; a first auto gain control circuit including a first auto gain control driving stage outputting a first control signal for controlling the gain of the attenuator; and a second auto gain control circuit including a second auto gain control driving stage outputting a second control signal for controlling the gain of the RF amplifier and for controlling the gain of the attenuator.

In another aspect of the instant invention, the receiver includes an attenuator for attenuating an antenna input signal; a first filter for receiving an output signal from the attenuator; an RF amplifier for amplifying an output signal from the first filter; a second filter for receiving an output signal from the RF amplifier; and a control circuit for controlling an attenuation of the attenuator based on the output signal of the first filter and the output signal from the second filter and controlling a gain of the RF amplifier based on the output signal from the second filter, but not on the output signal from the first filter.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
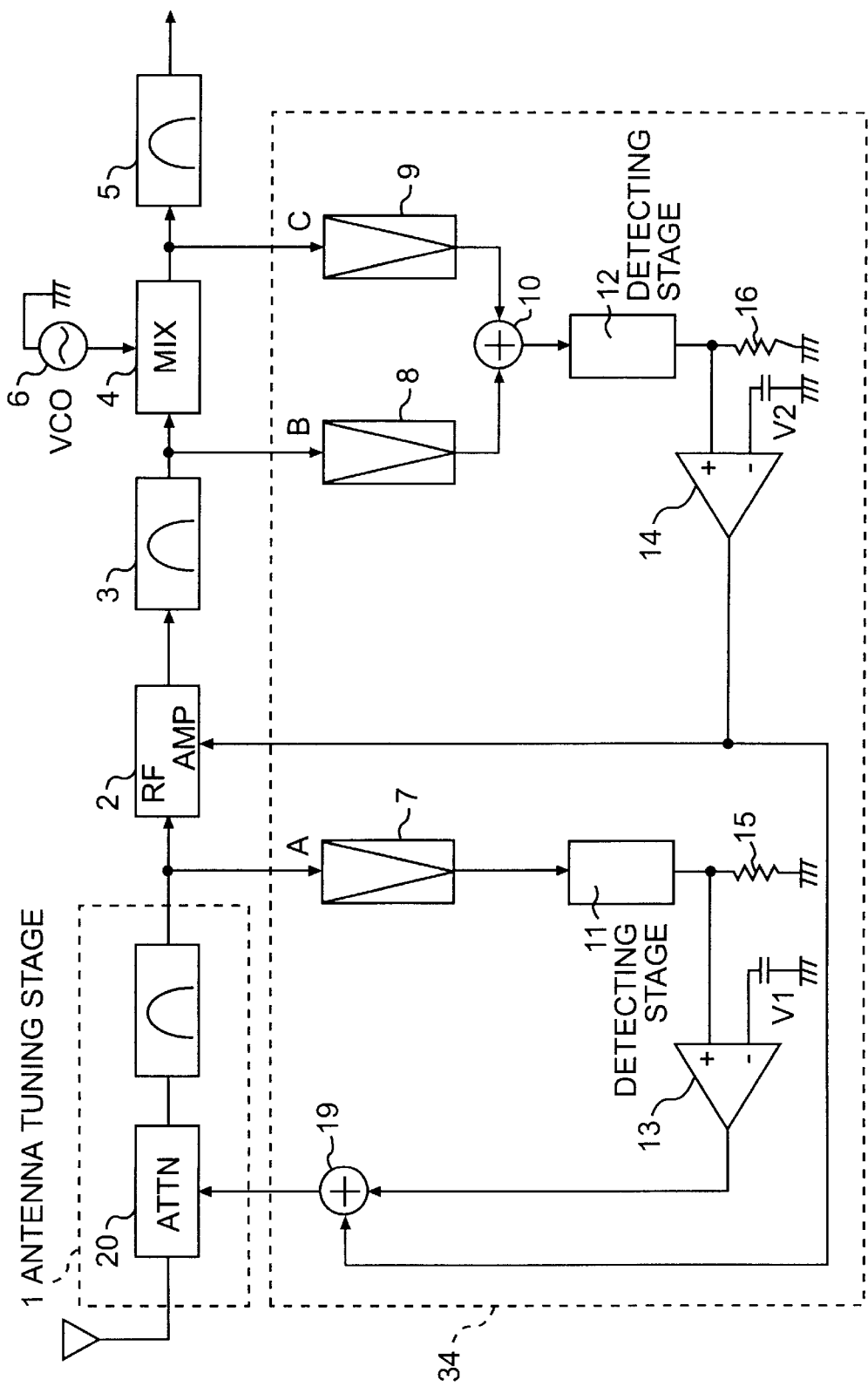
FIG. 1 is a diagram showing a first embodiment of the present invention.
Figure 7:
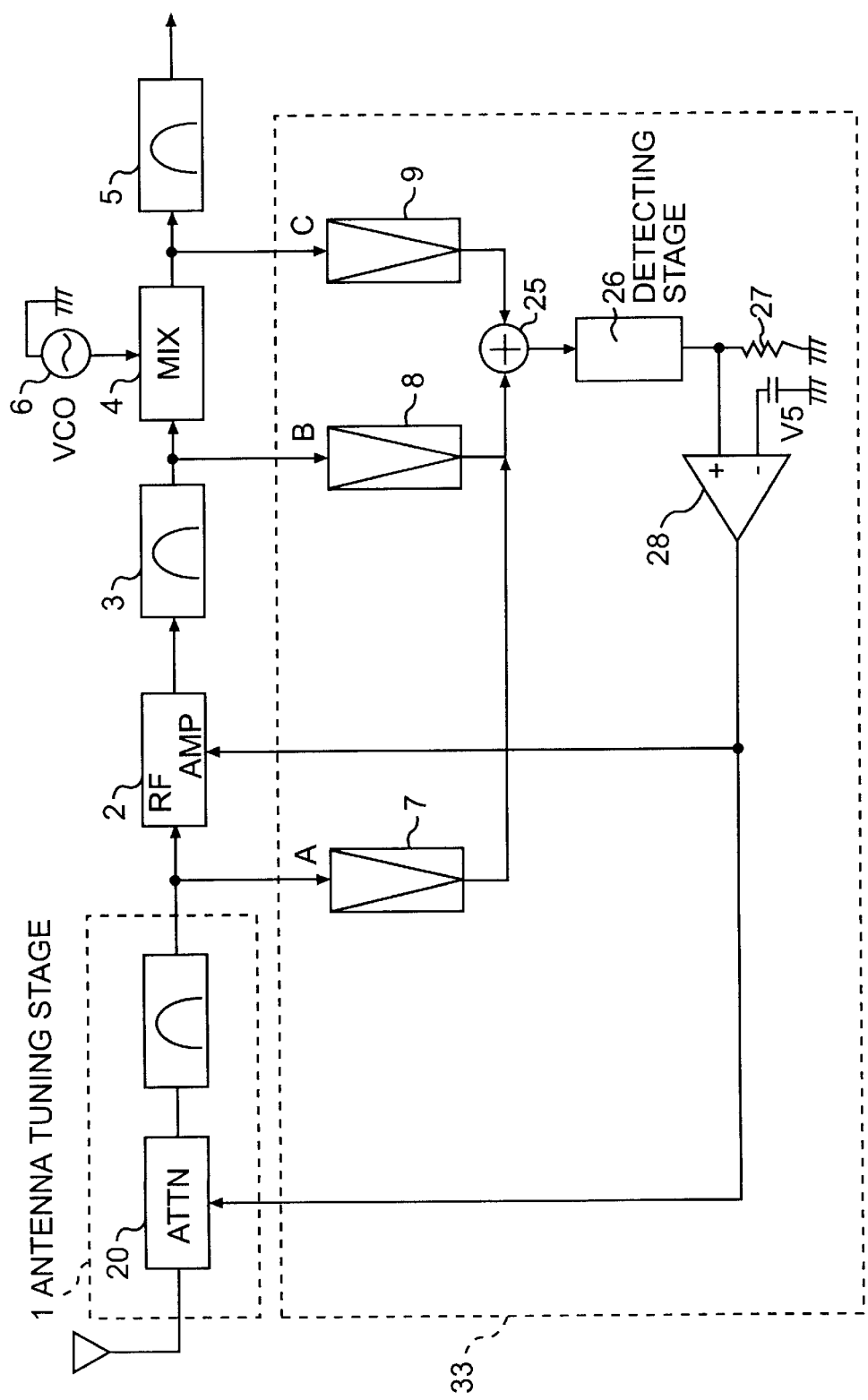
FIG. 7 is a diagram showing a conventional RF-AGC circuit within a receiver.

FIG. 1 is a block diagram of a first embodiment of the present invention, showing a front end portion of a receiver with an RF-AGC circuit 34. Like reference numerals are utilized to designate similar components as shown in FIG. 7.

According to the present invention, the receiver and control circuit are designed so that an output signal a of an antenna tuning stage 1 is fetched out from a circuit portion preceding the stage of an RF amplifier 2 to control an AGC circuit. Because this signal is not utilized to affect the control of the RF amplifier 2, the detrimental effects described in the foregoing discussion of prior art receiver arrangements are greatly minimized. Thus, according to the present invention, a detecting stage 11, an AGC driving stage 13 and an adding stage 19 are newly added.

An operation of each component will now be described in detail. The output signal a of the antenna tuning stage 1 is amplified by the AC amplifier 7 and further subjected to amplitude detection by the detecting stage 11. When this detection output level exceeds a reference voltage V1, the AGC driving stage 13 outputs a drive signal to the adding stage 19. On the other hand, output signals b, c from the RF tuning stage 3 and mixer 4 are amplified by AC amplifiers 8 and 9 respectively, supplied to an adding stage 10 and then subjected to amplitude detection by detecting stage 12. When this detection output level exceeds the reference voltage V2, the AGC driving stage 14 outputs a drive signal to the adding stage 19 and the RF amplifier 2.

As a result, an attenuator 20 is controlled by an output of the adding stage 19 and the RF amplifier 2 is controlled by an output of the AGC driving stage 14. Thus, the RF amplifier 2 and the attenuator 20 are subjected to gain control by feedback control loops, so that sound interruption due to the AGC operation decreases.

Figure 2:
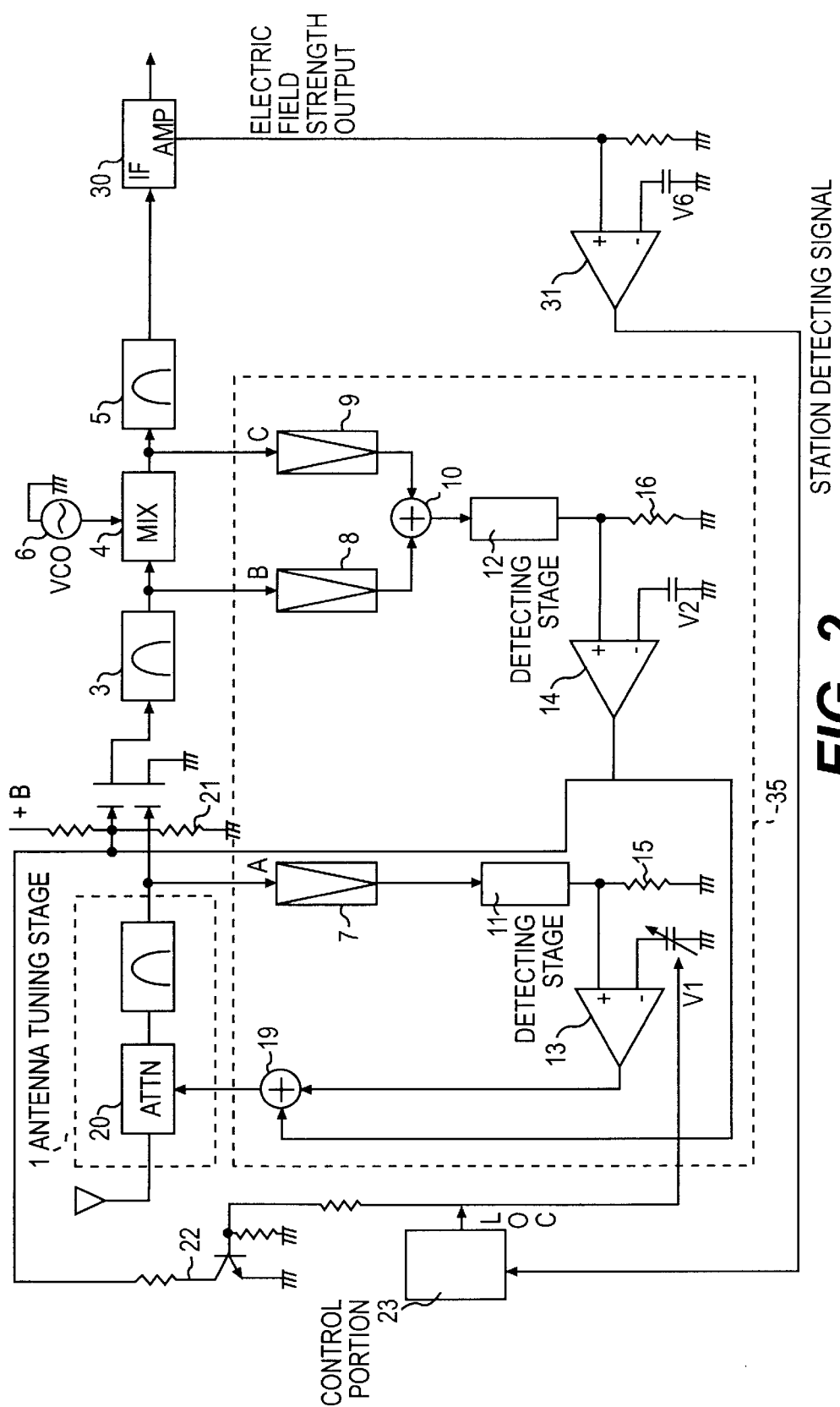
FIG. 2 is a diagram showing a second embodiment of the present invention.

FIG. 2 shows a second embodiment of the present invention which is principally based on the first embodiment, providing an improvement in the dynamic range of electric field strength signal upon execution of a search mode.

Generally, two kinds of search mode methods have been well known to search for other broadcasting stations within the same reception band. One of these methods is called the local search method for searching for broadcasting stations located near a listener's location with priority. Another method is called the DX search method for searching broadcasting stations both near a listener'locations as well as far away from the listeners location. In the local search method, in order to receive a station nearby (broadcasting station having a high reception level) with priority, in other words, not to detect a broadcasting station having a low reception level, the input signal is attenuated by a predetermined amount. This can be achieved by controlling the gain of the RF amplifier to attenuate as compared with the normal reception mode.

FIG. 2 is a schematic block diagram showing a receiver capable of executing such control. Upon execution of the local search mode, the control portion 23 outputs a high level signal (LOC) to a transistor 22. Upon receiving this signal, the transistor 22 is turned ON so that a second gate of a RF amplifier 21 is controlled and the gain of the RF amplifier 21 is lowered by a predetermined amount.

Figure 3:
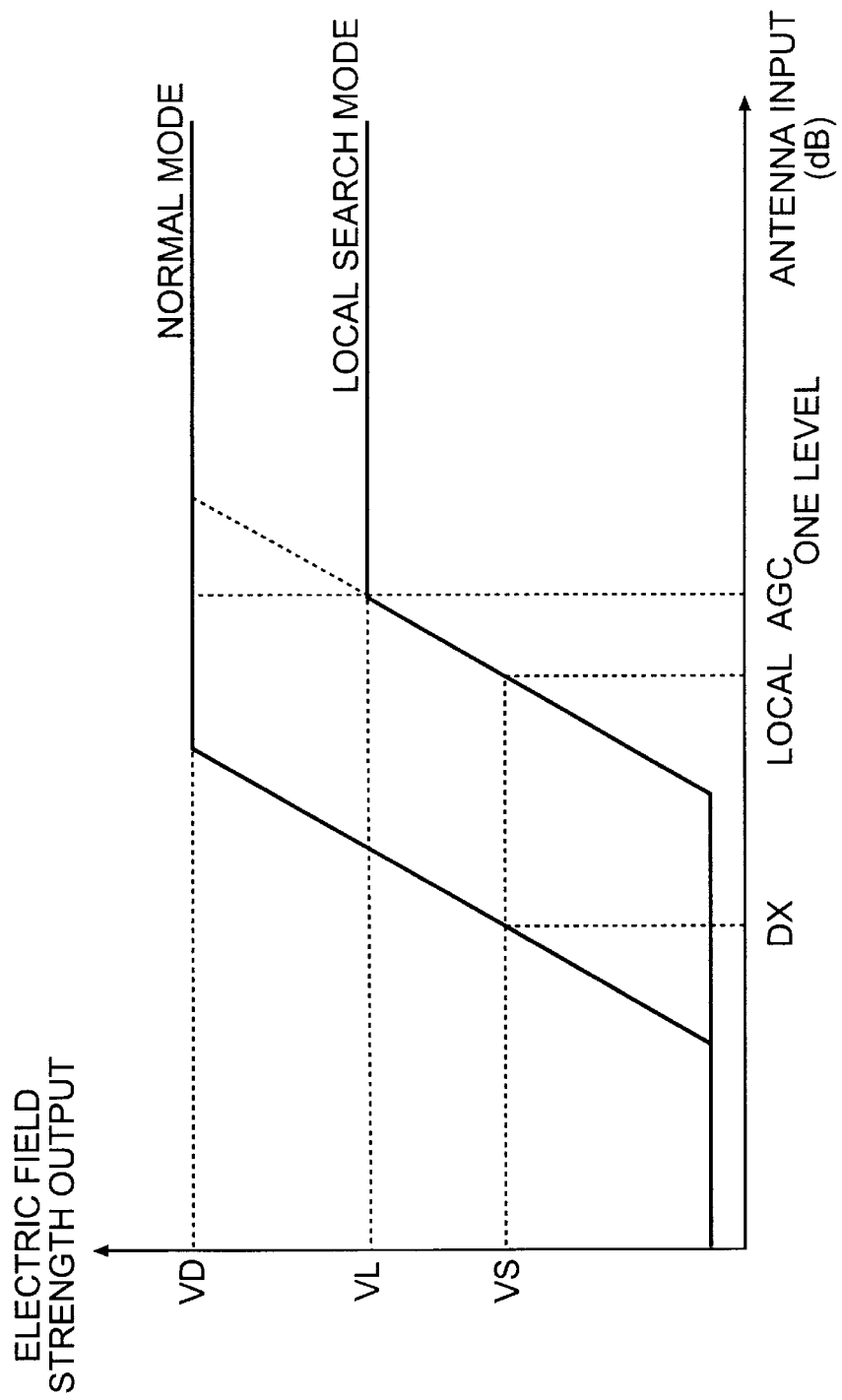
FIG. 3 is a diagram showing an electric field strength output characteristic with respect to an antenna input level.

FIG. 3 is a diagram showing a relation between an electric field strength level and an antenna input level, depending on whether or not such a control is executed. In FIG. 3, the abscissa axis indicates the antenna input level and the ordinate axis indicates the electric field strength level detected by an IF AMP 30. In the local search mode, the behavior of the electric filed strength level differs from in the normal reception mode because the gain of the RF amplifier 21 has been reduced as shown in the Figure. Therefore, assuming that the electric field strength level for determining that there is a broadcasting station by means of a comparator 31 is VS, a stop level in the local search mode is higher than the stop level in the DX search mode. Thus, the aforementioned two kinds of searches are possible.

The second embodiment is constructed so that the electric potential of comparison voltage V1 is raised so as to lower DC (direct current) gain of the AGC driving stage 13 in local search mode thereby retarding a control start level of the AGC driving stage 13 based on an output signal a of the antenna tuning stage as compared with the normal mode. Hereinafter, this point will de described in more detail.

The AGC ON level shown in FIG. 3 indicates a control start level of an AGC loop comprising the AC amplifier 7, detecting stage 11, AGC driving stage 13, adding stage 19, and attenuator 20 in a case where such a control is not executed. Because the AGC based on the output signal a of the antenna tuning stage uses a signal at a preceding stage of the RF amplifier 2, the AGC ON level of the local search mode is the same antenna input level as in the normal mode. Thus, the electric field signal is saturated at VL earlier than the normal mode's saturated level (VD). This means that the dynamic range of the electric field strength in the local search mode is narrower than in the normal mode, thereby becoming an obstacle to accurate measurement of reception level.

Figure 4:
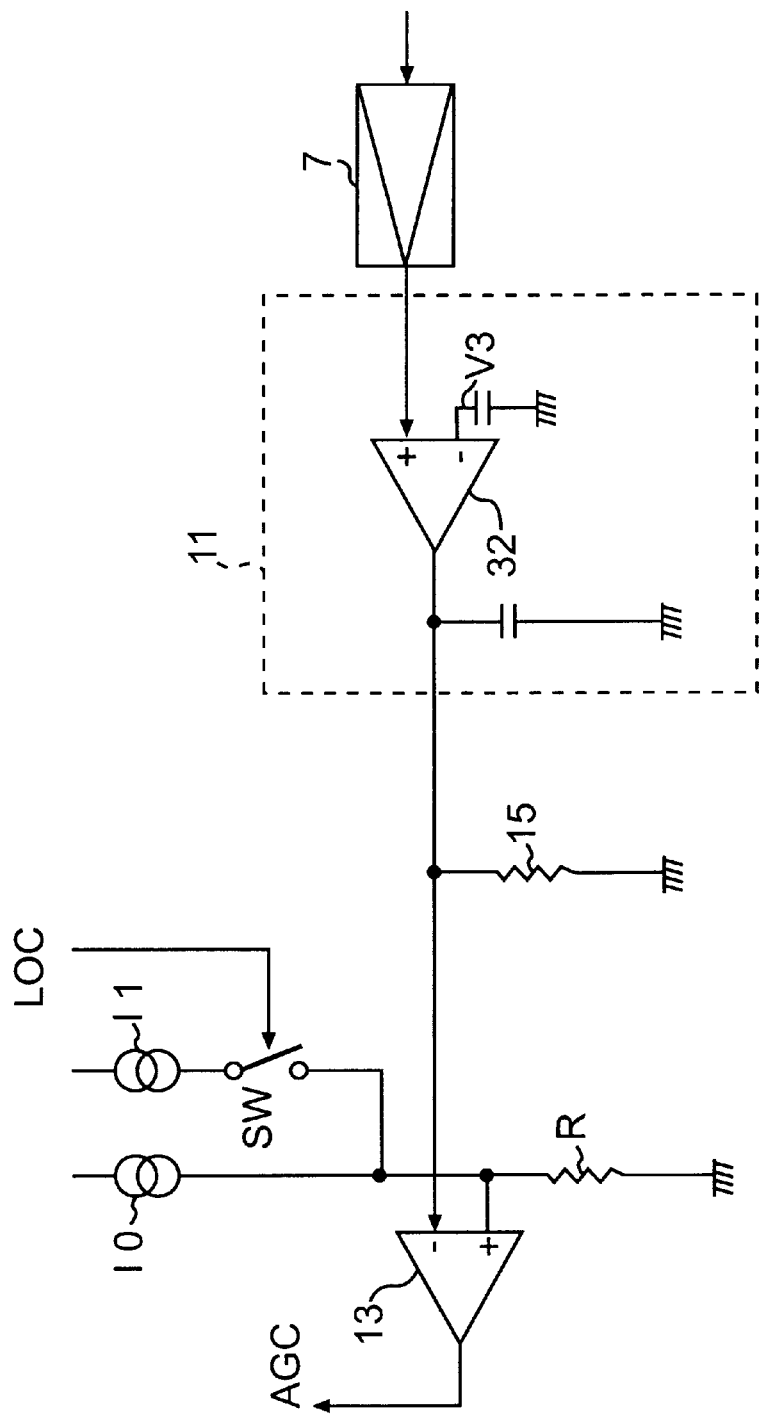
FIG. 4 is a diagram showing a detailed structure of an AFC driving stage 13.

In order to solve this inconvenient point, according to the second embodiment, the comparison voltage V1 (voltage between both ends of a resistor R) of the AGC driving stage 13 is constructed to be selectable between the local search mode and the normal mode as shown in FIG. 4. In the local search mode, the DC (direct current) gain of the AGC driving stage 13 is lowered so as to delay the control start level of the RF-AGC as compared with the normal mode. More specifically, this control is possible by closing the switch SW when the local search mode is entered to increase a quantity of current flowing through the resistor R shown in FIG. 4.

Figure 5:
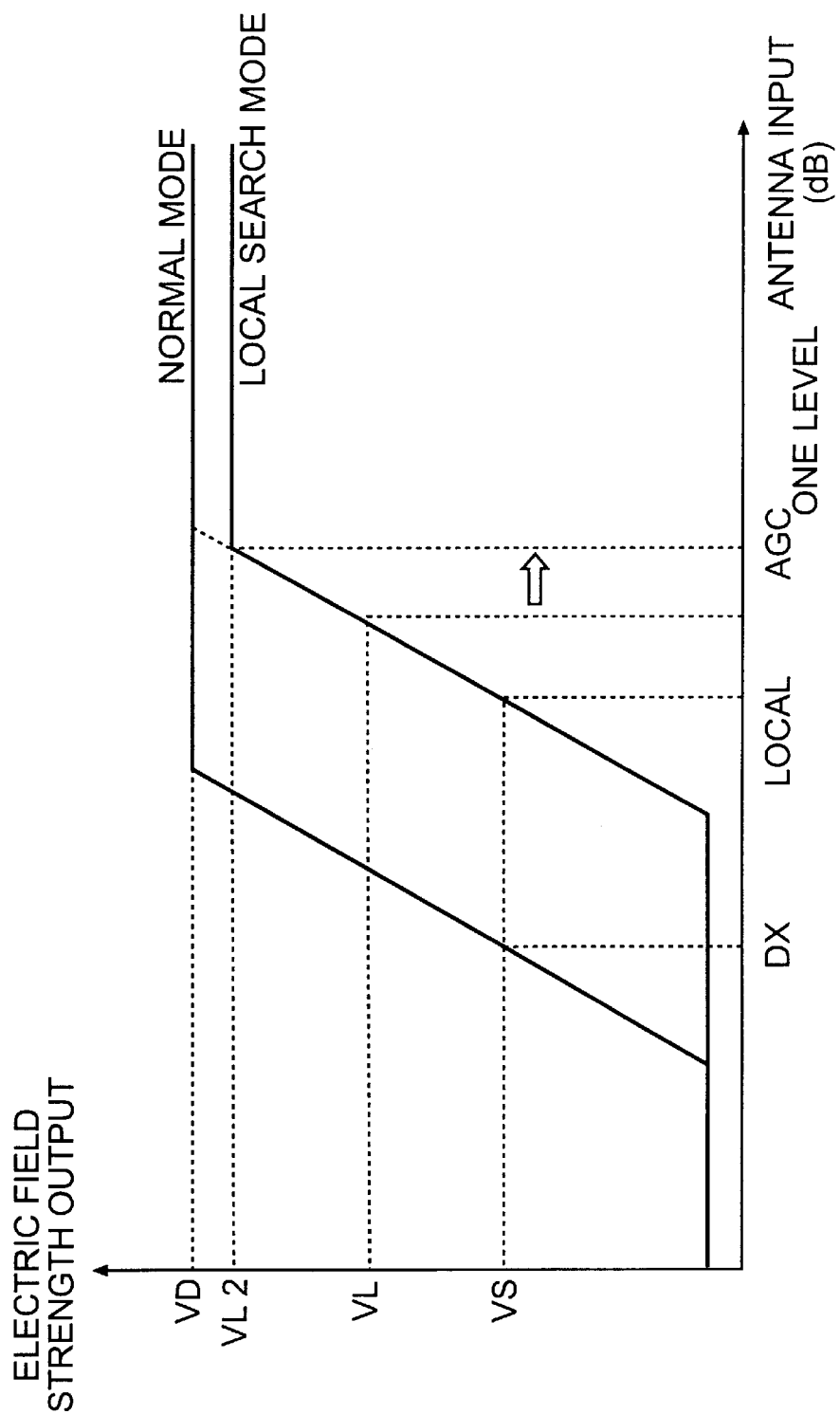
FIG. 5 is a diagram showing an electric field strength output characteristic with respect to an antenna input level.

FIG. 5 shows a relation between the electric field strength level and the antenna input level in a case where such a control is executed. In FIG. 5, the abscissa axis indicates the antenna input level and the ordinate axis indicates the electric filed strength level detected by the IF AMP 30. This means that the electric field strength level maintains linearity up to VL2 by retarding the start of AGC in a local search mode so that the dynamic range of the electric field strength level in the local search mode has been improved.

Figure 6:
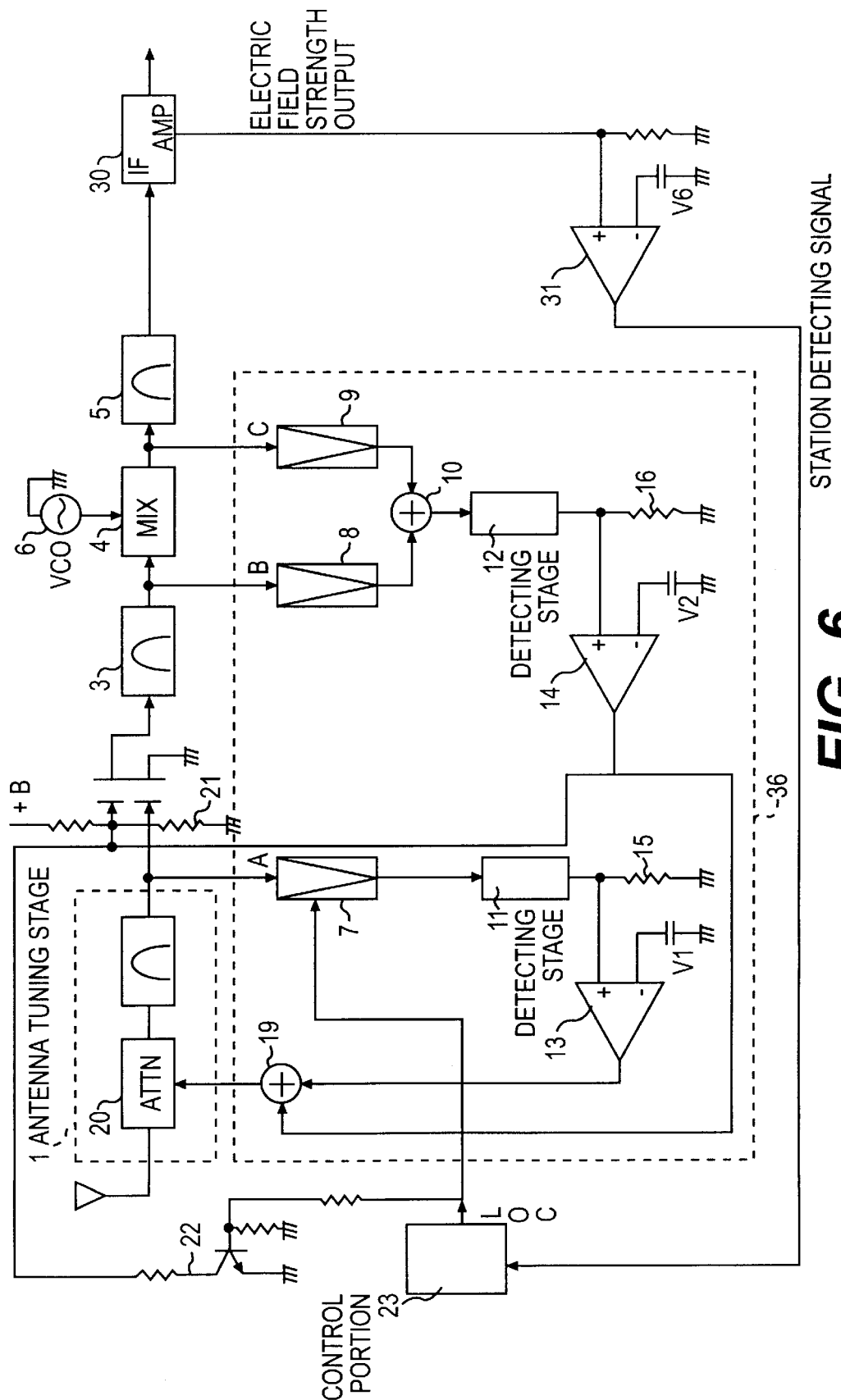
FIG. 6 is a diagram showing another embodiment of the present invention.

In addition to the above-described method, the same effect can be obtained by controlling the gain of the AC amplifier 7 as shown in FIG. 6. As shown in FIG. 6, the RF-AGC circuit 36 differs from the RF-AGC circuit 35 shown in FIG. 2. More particularly, when the LOC signal from the control portion 23 is supplied to the AC amplifier 7, the gain of the amplifier is decreased, or the amplification of the amplifier 7 is interrupted. As a result, the control start level of the RF-AGC is also delayed in the local search mode as compared with the normal mode.

In summary, the instant invention provides a receiver having a gain control circuit arrangement in which an antenna receives a transmitted signal and produces an antenna input signal. An attenuator in the receiver attenuates the antenna input signal. An RF amplifier amplifies a signal from the attenuator. A first filter extracts a first filtered signal having a first band width from a receiver portion before the RF amplifier stage. A second filter extracts a second filtered signal having a second band width from a receiver portion poststage of the RF amplifier. The second band width is narrower than the first band width. A controller controls an attenuation of the attenuator based on the first filtered signal and the second filtered signal, and controls a gain of the RF amplifier based on the second filtered signal.

As described above, the present invention is capable of providing an RF-AGC circuit within a receiver in which the sound interruption problem of prior art arrangements is improved.

It will be apparent to those skilled in the art that various modifications and variations can be made in the receiver of the present invention without departing from the spirit or scope of the invention. Thus, it is intended that the present invention cover the modifications and variations of this invention provided they come within the scope of the appended claims and their equivalents.

What is claimed is:

1. A receiver comprising:
an attenuator for attenuating an antenna input signal and producing an output signal;
a first filter for filtering the output signal of the attenuator and prodcuing an output signal;
an RF amplifier for amplifying the output signal from the first filter and producing an output signal;
a second filter for filtering the output signal from the RF amplifier and producing an output signal;
a first auto gain control circuit including a first auto gain control driving stage that receives the output signal from the first filter and outputs a first control signal for controlling the gain of the attenuator; and
a second auto gain control circuit including a second auto gain control driving stage outputting a second control signal for controlling the gain of the RF amplifier and for controlling the gain of the attenuator.

2. The receiver of claim 1, wherein the first auto gain control circuit further comprises:
a first AC amplifier for receiving the first filter output signal at its input;
a detecting stage receiving an output signal from the first AC amplifier and supplying an output signal to the first auto gain control driving stage;
wherein the first auto gain control driving stage outputs the first control signal based on a comparison with a first predetermined reference voltage level.

3. The receiver of claim 2, wherein the second auto gain control circuit further comprises:
a second AC amplifier for receiving the second filter output signal at its input;
a second detecting stage receiving an output signal from the second AC amplifier and supplying an output signal to the second auto gain control driving stage;
wherein the second auto gain control driving stage outputs the second control signal based on a comparison with a second predetermined reference voltage level.

4. The receiver of claim 1, further comprising:
a mixer for converting the output signal from the second filter into a specific frequency and producing an output signal;
a third filter for receiving the output signal from the mixer and producing an output signal; and
an IF amplifier for receiving the output signal from the third filter.

5. The receiver of claim 1, further comprising:
a control circuit for lowering the direct current gain of the first auto gain control driving stage during a local search tuning mode.

6. The receiver of claim 2, further comprising:
a control circuit for lowering the gain of the first AC amplifier during a local search tuning mode.

7. The receiver of claim 1, further comprising:
a control circuit for changing a control start point of the first auto gain control circuit during a local search tuning mode.

8. A receiver comprising:
an attenuator for attenuating an antenna input signal;
a first filter for receiving an output signal from the attenuator;
an RF amplifier for amplifying an output signal from the first filter;
a second filter for receiving an output signal from the RF amplifier; and
a control circuit for controlling an attenuation of the attenuator based on the output signal of the first filter and the output signal from the second filter and controlling a gain of the RF amplifier based on the output signal from the second filter, but not based on the output signal from the first filter.

9. The receiver as claimed in claim 8, further comprising a circuit for changing a control start level of the control circuit during a local search mode.

10. A receiver comprising:
an attenuator for attenuating an antenna input signal and producing an output signal;
a first filter for filtering the output signal of the attenuator and producing an output signal;
an RF amplifier for amplifying the output signal from the first filter and producing an output signal;
a second filter for filtering the output signal from the RF amplifier and producing an output signal;
a first auto gain control circuit including a first auto gain control driving stage outputting a first control signal for controlling the gain of the attenuator; and a second auto gain control circuit including a second auto gain control driving stage outputting a second control signal for controlling the gain of the RF amplifier and for controlling the gain of the attenuator, wherein an input signal for the second auto gain control driving stage has a smaller bandwidth than that of one for the first auto gain control driving stage.

11. The receiver of claim 10, wherein the first auto gain control circuit further comprises:

a first AC amplifier for receiving the first filter output signal at its input;

a detecting stage receiving an output signal from the first AC amplifier and supplying an output signal to the first auto gain control driving stage;

wherein the first auto gain control driving stage outputs the first control signal based on a comparison with a first predetermined reference voltage level.

12. The receiver of claim 11, wherein the second auto gain control circuit further comprises:

a second AC amplifier for receiving the second filter output signal at its input;

a second detecting stage receiving an output signal from the second AC amplifier and supplying an output signal to the second auto gain control driving stage;

wherein the second auto gain control driving stage outputs the second control signal based on a comparison with a second predetermined reference voltage level.

13. The receiver of claim 10, further comprising:

a mixer for converting the output signal from the second filter into a specific frequency and producing an output signal;

a third filter for receiving the output signal from the mixer and producing and output signal; and an IF amplifier for receiving the output signal from the third filter.

14. The receiver of claim 10, further comprising:

a control circuit for lowering the direct current gain of the first auto gain control driving stage during a local search tuning mode.

15. The receiver of claim 11, further comprising:

a control circuit for lowering the gain of the first AC amplifier during a local search tuning mode.

16. The receiver of claim 10, further comprising:

a control circuit for changing a control start point of the first auto gain control circuit during a local search tuning mode.

* * * * *